(12) United States Patent
Roh et al.

(10) Patent No.: US 7,803,671 B2
(45) Date of Patent: Sep. 28, 2010

(54) METHOD OF MANUFACTURING A DISPLAY SUBSTRATE

(75) Inventors: Nam-Seok Roh, Seongnam-si (KR); Jung-Mok Bae, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 117 days.

(21) Appl. No.: 11/854,291

(22) Filed: Sep. 12, 2007

(65) Prior Publication Data
US 2008/0064129 A1  Mar. 13, 2008

(30) Foreign Application Priority Data
Sep. 12, 2006  (KR) .............. 10-2006-0088020

(51) Int. Cl.
*H01L 21/00* (2006.01)
(52) U.S. Cl. .............. 438/151; 438/158; 257/E21.413; 257/E21.414
(58) Field of Classification Search .............. 438/151, 438/158; 257/E21.413, E21.414
See application file for complete search history.

(56) References Cited

U.S. PATENT DOCUMENTS 6,613,610 B2 * 9/2003 Iwafuchi et al. .............. 438/128
7,315,044 B2 * 1/2008 Hwang et al. .................. 257/72

FOREIGN PATENT DOCUMENTS

KR  2003-0019580  3/2003

OTHER PUBLICATIONS

English Abstract for Publication No. 2003-0019580.

* cited by examiner

*Primary Examiner*—Charles D Garber
*Assistant Examiner*—Stanetta D Isaac
(74) *Attorney, Agent, or Firm*—F. Chau & Associates, LLC

(57) ABSTRACT

A method of manufacturing a display substrate comprises forming a thin-film transistor (TFT) on a silicon wafer, transferring the TFT from the silicon wafer onto a base substrate using a stamp unit and forming a pixel electrode electrically connected to the TFT.

36 Claims, 13 Drawing Sheets

METHOD OF MANUFACTURING A DISPLAY SUBSTRATE

CROSS-REFERENCE TO RELATED APPLICATIONS

This application claims priority under 35 U.S.C. §119 to Korean Patent Application No. 2006-88020, filed on Sep. 12, 2006 in the Korean Intellectual Property Office (KIPO), the contents of which are herein incorporated by reference in their entirety.

BACKGROUND OF THE INVENTION

1. Field of the Invention

The present invention relates to a method of manufacturing a display substrate. More particularly, the present invention relates to a method of manufacturing a display substrate at a reduced manufacturing cost.

2. Description of Related Art

Typically, a liquid crystal display (LCD) apparatus displays an image by using optical and electrical characteristics of liquid crystal, such as an anisotropic refractive index, an anisotropic dielectric constant, etc. The LCD apparatus includes an LCD panel that displays images by using light provided by a backlight assembly.

The LCD panel includes an array substrate having a thin-film transistor (TFT) and a pixel electrode, a color filter substrate having a common electrode and a color filter, and a liquid crystal layer interposed between the array substrate and the color filter substrate.

Typically, a TFT of the array substrate is formed by chemical vapor deposition (CVD), especially by plasma-enhanced CVD (PECVD). However, equipment for CVD is needed to perform the CVD process.

LCD panel screen sizes are continuing to increase. As the size of the LCD panel increases, the size of the array substrate increases. As a result, the size of the equipment needed for the CVD is increased. However, when the size of the equipment for the CVD is increased, installation and management costs may be increased. Thus, manufacturing costs may be increased with larger LCD panel screen sizes.

SUMMARY OF THE INVENTION

According to an embodiment of the present invention, a method of manufacturing a display substrate comprises forming a thin-film transistor (TFT) on a silicon wafer, transferring the TFT from the silicon wafer onto a base substrate using a stamp unit, and forming a pixel electrode electrically connected to the TFT.

The TFT may include, for example, a semiconductor layer, a gate insulating film, a gate electrode, a source electrode and a drain electrode. The TFT may further include an electrode protecting film.

The semiconductor layer may be disposed on a base substrate. The gate insulating film may be disposed on the semiconductor layer, and may have a first contact hole and a second contact hole for exposing a portion of the semiconductor layer. The gate electrode may be disposed on the gate insulating film, and may be interposed between the first contact hole and the second contact hole. The source electrode may be spaced apart from a first side of the gate electrode to be disposed on the gate insulating film, and may be electrically connected to a portion of the semiconductor layer through the first contact hole. The drain electrode may be spaced apart from a second side of the gate electrode to be disposed on the gate insulating film, and may be electrically connected to a portion of the semiconductor layer through the second contact hole. The electrode protecting film may be disposed on the gate insulating film for covering the gate electrode, the source electrode and the drain electrode.

Forming the pixel electrode may include forming a gate line electrically connected to the gate electrode of the TFT, forming a data line electrically connected to the data electrode of the TFT, and forming the pixel electrode electrically connected to the drain electrode of the TFT.

The TFTs are not directly formed on a base substrate, but the TFTs are transferred from a silicon wafer onto a base substrate. Thus, costs for chemical vapor deposition (CVD) equipment may be reduced and manufacturing costs for a display substrate may be reduced.

BRIEF DESCRIPTION OF THE DRAWINGS

The present invention will become readily apparent by reference to the following detailed description when considered in conjunction with the accompanying drawings wherein.

DETAILED DESCRIPTION OF EXAMPLARY EMBODIMENTS

Figure 1:
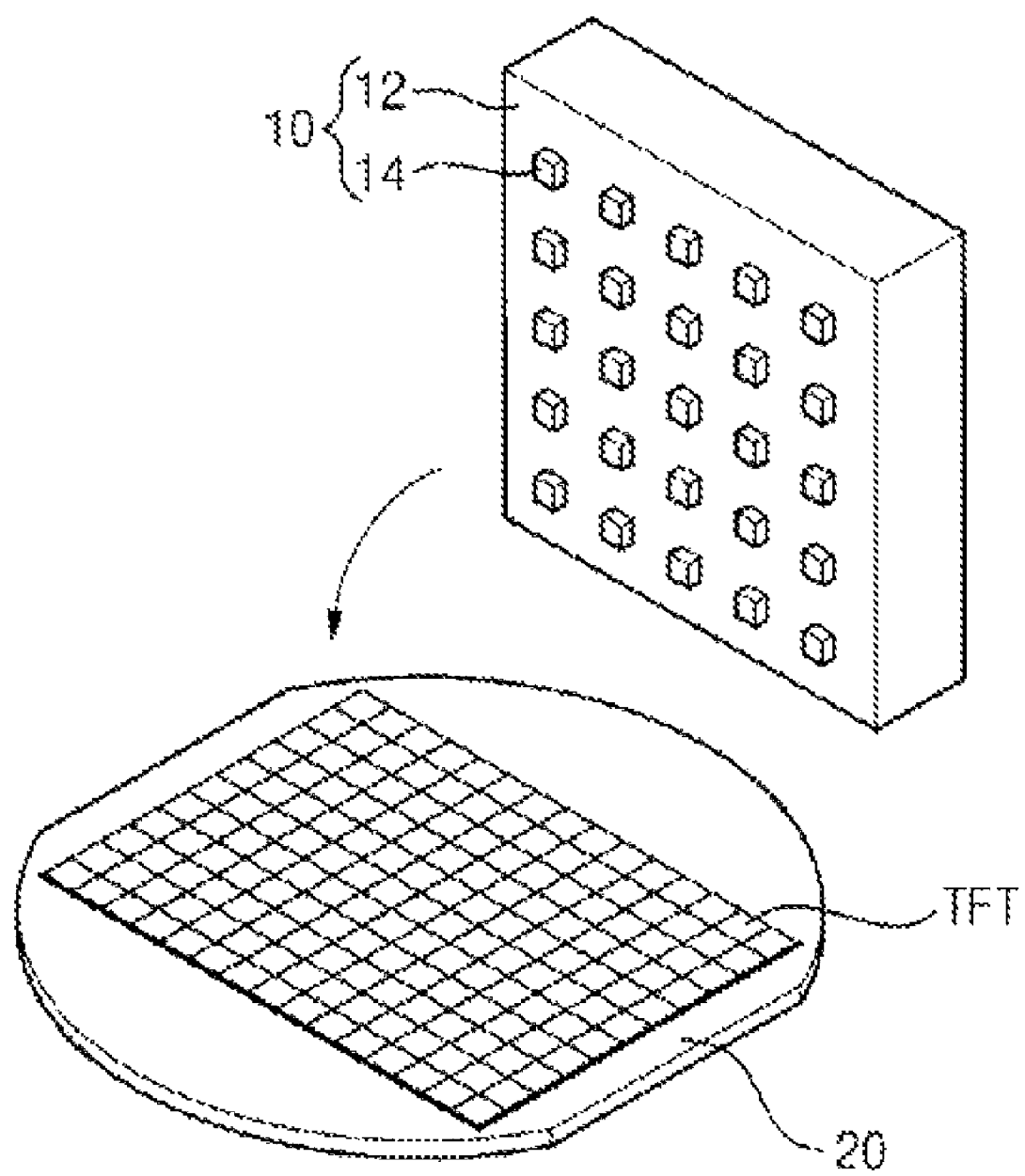
FIG. 1 is a perspective view illustrating a stamp unit and a silicon wafer used for a method of manufacturing a display substrate in accordance with an exemplary embodiment of the present invention.

The invention is described more fully hereinafter with reference to the accompanying drawings, in which embodiments of the invention are shown. This invention may, however, be embodied in many different forms and should not be construed as limited to embodiments set forth herein. Rather, embodiments are provided so that this disclosure will be thorough and complete, and will fully convey the scope of the invention to those skilled in the art. In the drawings, the size and relative sizes of layers and regions may be exaggerated for clarity.

Hereinafter, embodiments of the present invention will be explained in detail with reference to the accompanying drawings.

Figure 2:
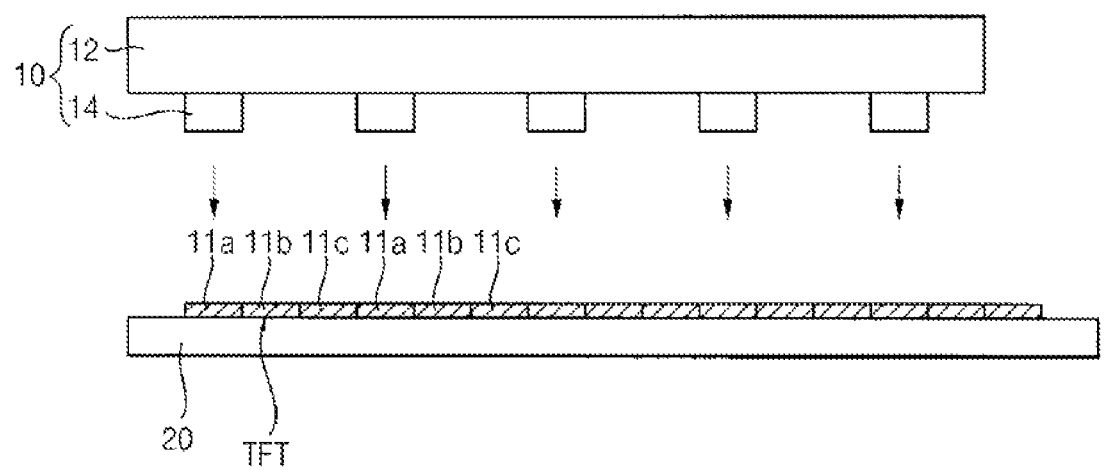
FIG. 2 is a cross-sectional view illustrating the stamp unit and the silicon wafer of FIG. 1.

FIG. 1 is a perspective view illustrating a stamp unit and a silicon wafer used for a method of manufacturing a display substrate in accordance with an exemplary embodiment of the present invention. FIG. 2 is a cross-sectional view illustrating the stamp unit and the silicon wafer of FIG. 1.

Referring to FIGS. 1 and 2, a plurality of thin-film transistors (TFTs) is disposed on a silicon wafer 20. For example, the TFTs are disposed on the silicon wafer 20 by chemical vapor deposition (CVD). The TFTs are formed on the silicon wafer 20 through a deposition process, a photolithography process, an impurity implanting process, etc. For example, the TFTs are densely integrated on the silicon wafer 20 in a matrix configuration.

A stamp unit 10 for separating the TFTs from the silicon wafer 20 includes a stamp body 12 and a plurality of stamps 14.

Figure 3:
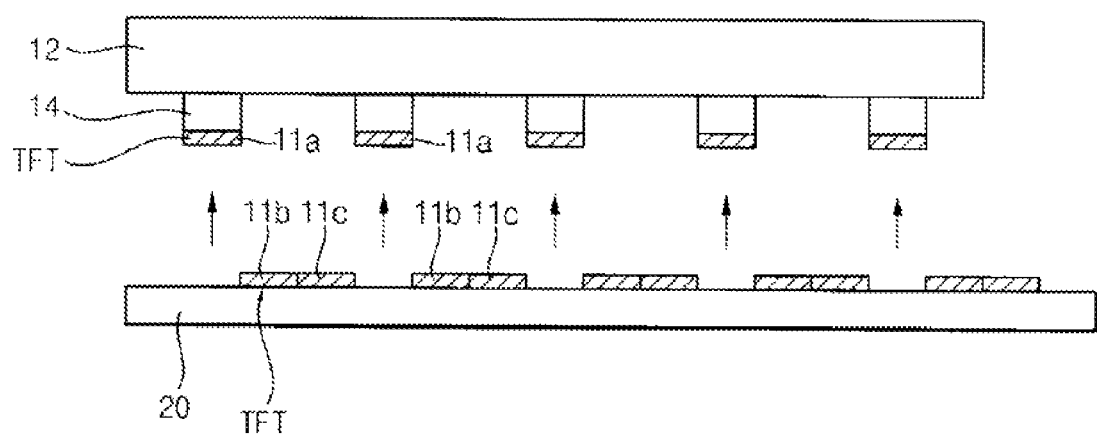
FIG. 3 is a cross-sectional view illustrating attaching thin-film transistors (TFTs) of a first group to the stamp unit of FIG. 1.
Figure 4:
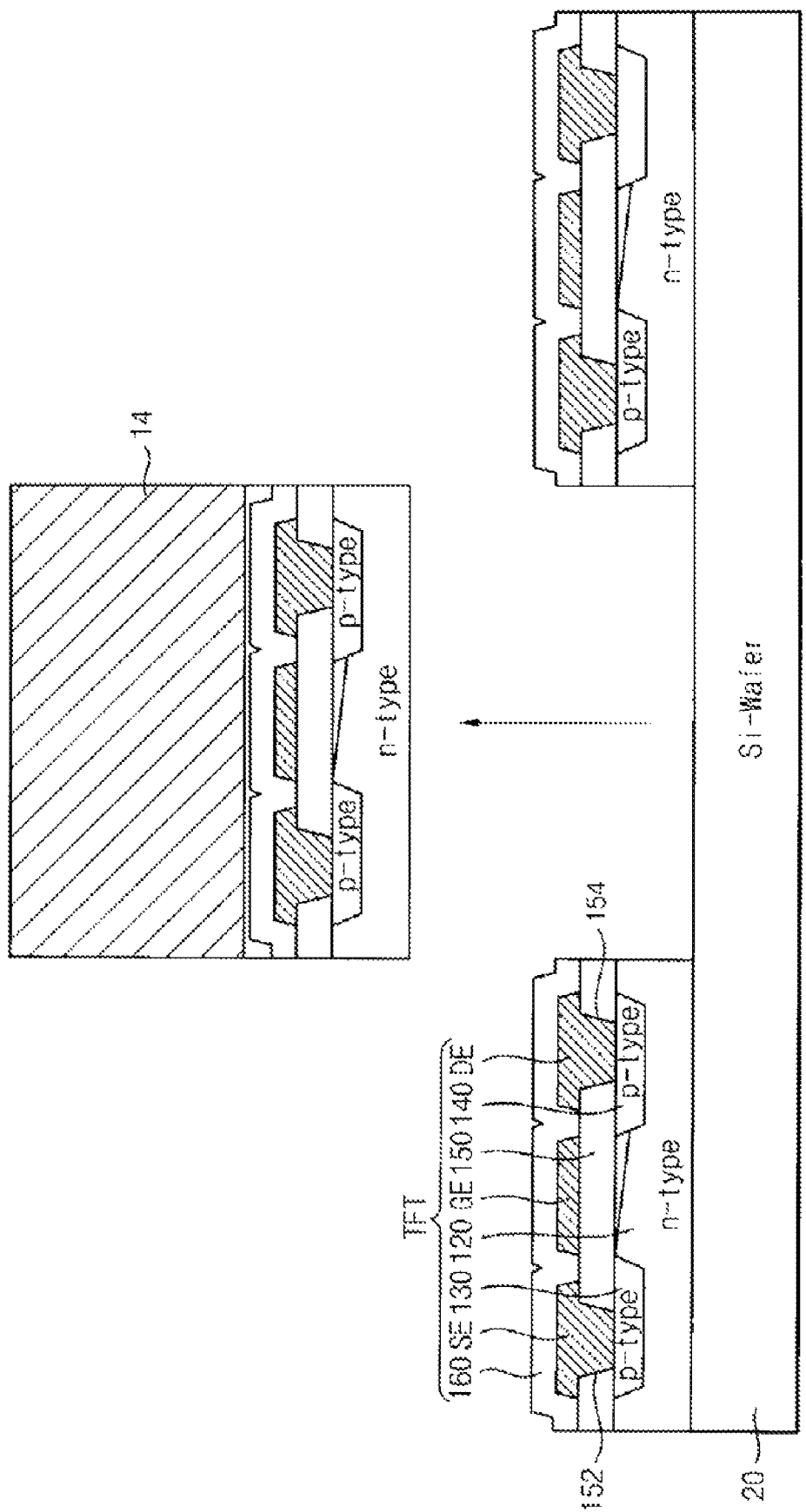
FIG. 4 is an enlarged cross-sectional view illustrating separating one of the TFTs from the silicon wafer of FIG. 3.

FIG. 3 is a cross-sectional view illustrating attaching TFTs of a first group to the stamp unit of FIG. 1. FIG. 4 is a cross-sectional view illustrating separating one of the TFTs from the silicon wafer of FIG. 3.

Referring to FIG. 3, the TFTs are divided into a plurality of groups. For example, the TFTs are divided into a first group, a second group and a third group.

The TFTs 11a of the first group, the TFTs 11b of the second group and the TFTs 11c of the third group may be alternately arranged on the silicon wafer 20 The TFTs 11a of the first group are separated from the silicon wafer 20 by a stamp unit 10. To separate the TFTs, for example, a surface of the silicon wafer 20 having the TFTs may be treated by a predetermined process. For example, a portion of the silicon wafer may be etched along a dividing line of the silicon wafer 20 having the TFTs. Thus, the TFTs may be separated from the silicon wafer 20.

The stamp body 12, for example, may have a rectangular shape. For example, a surface of the stamp body 12 facing the silicon wafer 20 may have substantially the same size as a surface of the silicon wafer 20. Alternatively, the surface of the stamp body 12 facing the silicon wafer 20 may be smaller or bigger than the surface of the silicon wafer 20.

The stamps 14 are disposed at the surface of the stamp body 12 facing the silicon wafer 20. The TFTs 11a of the first group are disposed at the stamps 14. For example, an adhesive surface of each of the stamps 14 having each of the TFTs 11a of the first group has substantially the same size and shape as that of an upper surface of the TFT. The stamps 14 corresponding to the TFTs 11a of the first group are disposed at the surface of the stamp body 12. The stamps 14 are uniformly separated from each other.

Referring to FIG. 4, each of the TFTs on the silicon wafer 20 includes, for example, a semiconductor layer a gate insulating film 150, a gate electrode GE, a source electrode SE, a drain electrode DE and an electrode protecting film 160.

The semiconductor layer is disposed on the silicon wafer 20. The semiconductor layer includes, for example, a main semiconductor layer 120, a first semiconductor part 130 and a second semiconductor part 140. The detailed explanation about the semiconductor layer is followed.

The gate insulating film 150 is disposed on the semiconductor layer. The gate insulating film 150 has a first contact hole 152 and a second contact hole 154 for partially exposing the semiconductor layer. The gate insulating film 150 includes, for example, silicon nitride (SiNx) or silicon oxide (SiOx).

The gate electrode GE is disposed on the gate insulating film 150. The gate electrode GE is disposed between the first contact hole 152 and the second contact hole 154.

The source electrode SE is spaced apart from the gate electrode GE, and is disposed on the gate insulating film 150. The source electrode SE is electrically connected to the semiconductor layer through the first contact hole 152.

The drain electrode DE is spaced apart from the gate electrode GE, and is disposed on the gate insulating film 150. The gate insulating film 150 is electrically connected to the second contact hole 154.

For example, the gate electrode GE, the source electrode SE and the drain electrode DE correspond to each other, and are extended along substantially the same direction.

The electrode protecting firm 160 covers the gate electrode GE, the source electrode SE and the drain electrode DE to protect the gate electrode GE, the source electrode SE and the drain electrode DE, and is disposed on the gate insulating film 150. The electrode protecting film 160 includes, for example, silicon nitride (SiNx) or silicon oxide (SiOx).

The main semiconductor layer 120 is disposed on the silicon wafer 20. The first semiconductor part 130 is disposed on the main semiconductor layer 120 corresponding to the source electrode SE. The first semiconductor part 130 is electrically connected to the source electrode SE through the first contact hole 152. The second semiconductor part 140 is disposed on the main semiconductor layer 120 corresponding to the drain electrode DE. The second semiconductor part 140 is electrically connected to the drain electrode DE through the second contact hole 154.

The first semiconductor part 130 and the second semiconductor part 140 are, for example, formed by implanting a first dopant into silicon. The main semiconductor layer 120 may include, for example, pure silicon. Alternatively, the main semiconductor layer 120 may be formed through implanting the first dopant and implanting a second dopant that is different from the first dopant.

In FIG. 4, the first dopant includes first ions from IUPAC Group 13 (the boron group) or IUPAC Group 15 (the nitrogen group) of the Periodic Table and the second dopant includes second ions from Group 13 or Group 15. For example, the first dopant includes ions from Group 13, and the second dopant includes ions from Group 15. Alternatively the first dopant may include ions from Group 15, and the second dopant may include ions from Group 13. In FIG. 4 the first semiconductor part 130 and the second semiconductor part 140 in FIG. 4 are p-type semiconductors and the main semiconductor layer 120 is an n-type semiconductor.

Figure 5:
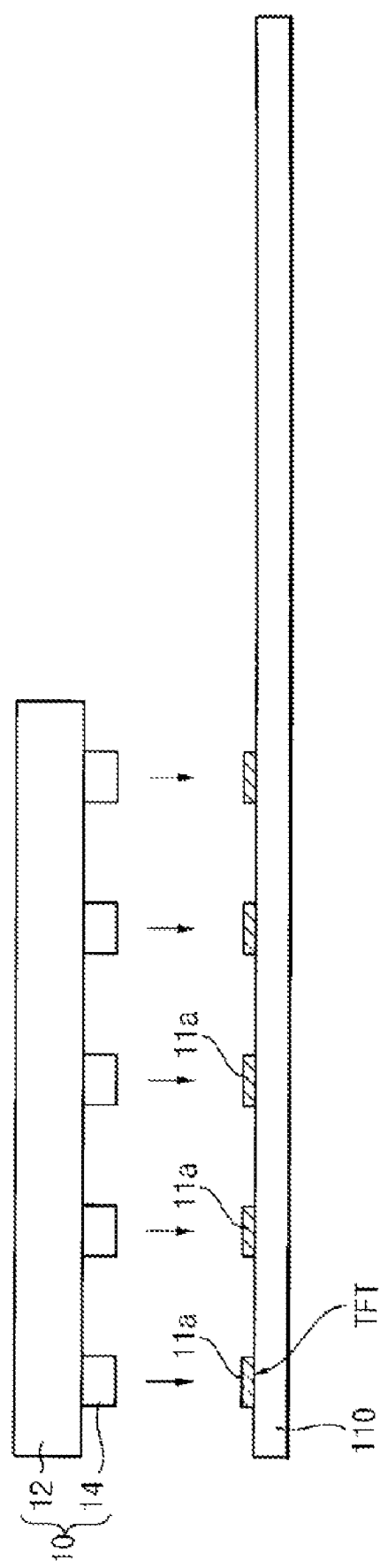
FIG. 5 is a cross-sectional view illustrating transferring the TFTs of the first group attached at the stamp unit of FIG. 3 onto a base substrate in accordance with an exemplary embodiment of the present invention.

FIG. 5 is a cross-sectional view illustrating transferring the TFTs of the first group attached at the stamp unit of FIG. 3 onto a base substrate in accordance with an exemplary embodiment of the present invention.

Referring to FIG. 5, the TFTs 11a of the first group at the stamp unit 10 are transferred onto a portion of the base substrate 110. For examples the stamp unit 10 moves toward the base substrate 110, and the TFTs 11a of the first group adhered to the stamps 14 of the stamp unit are disposed on the base substrate 110. Here, for example the surface of the base substrate 110 may be surface treated for better adherence of the TFTs 11a of the first group air than the stamps 14. For example, the surface treatment may be cleaning, plasma implanting etc.

For example, an adhesive strength between the stamp 14 and the TFTs 11a of the first group may be greater than an adhesive strength between the silicon wafer 20 and the TFTs 11a of the first group. In addition, an adhesive strength between the base substrate 110 and the TFTs 11a of the first group may be greater than the adhesive strength between the stamp 14 and the TFTs 11a of the first group. The base substrate 110 includes a material that adheres to the TFTs 11a of the first group. The adhesive strength between the stamp 14 of the stamp unit 10 and the TFTs 11a of the first group is less than that between the base substrate 110 and the TFTs 11a of the first group and greater than that between the silicon wafer 20 and the TFTs 11a of the first group.

The base substrate 110 is a transparent substrate. Alternatively, the base substrate 110 may be an opaque substrate. For example, the base substrate 110 may include glass, quartz or synthetic resin. Alternatively, the base substrate 110 may include an opaque metal such as stainless steel.

Figure 6:
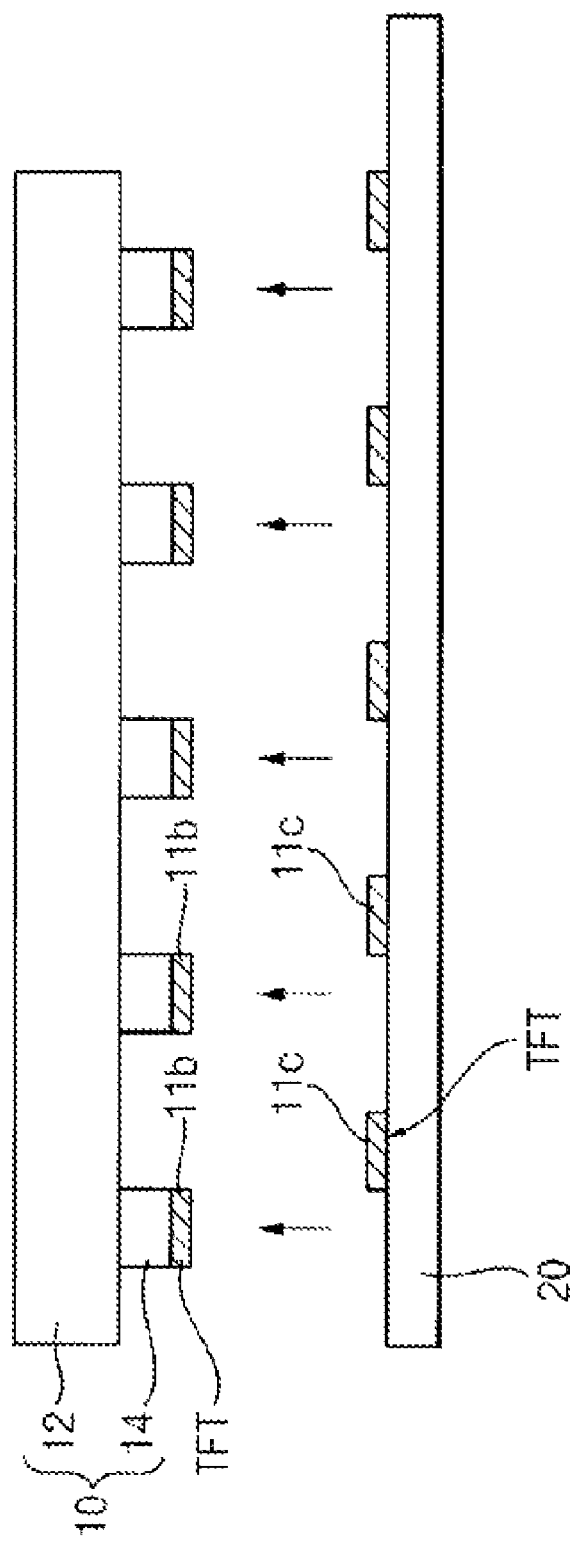
FIG. 6 is a cross-sectional view illustrating attaching TFTs of a second group to the stamp unit of FIG. 1.

FIG. 6 is a cross-sectional view illustrating attaching TFTs of a second group to the stamp unit of FIG. 1.

Referring to FIG. 6, the TFTs 11b of the second group are separated from a silicon wafer 20 by using the stamp unit 10. For example, the TFTs 11b of the second group may be adjacent to positions of the silicon wafer 20 on which the TFTs 11a of the first group have been attached.

Figure 7:
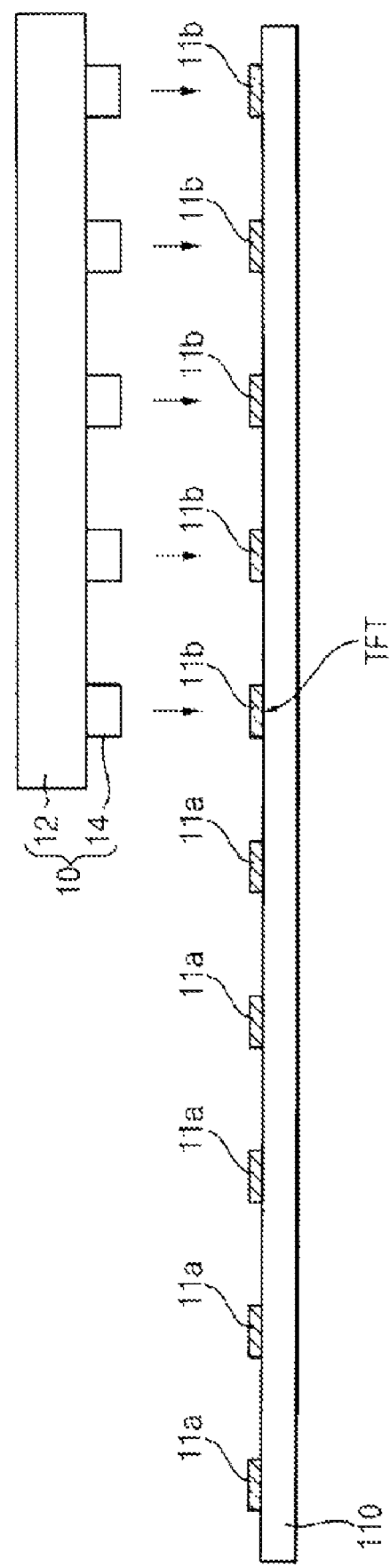
FIG. 7 is a cross-sectional view illustrating transferring the TFTs of the second group attached to the stamp unit onto the base substrate of FIG. 5.
Figure 8:
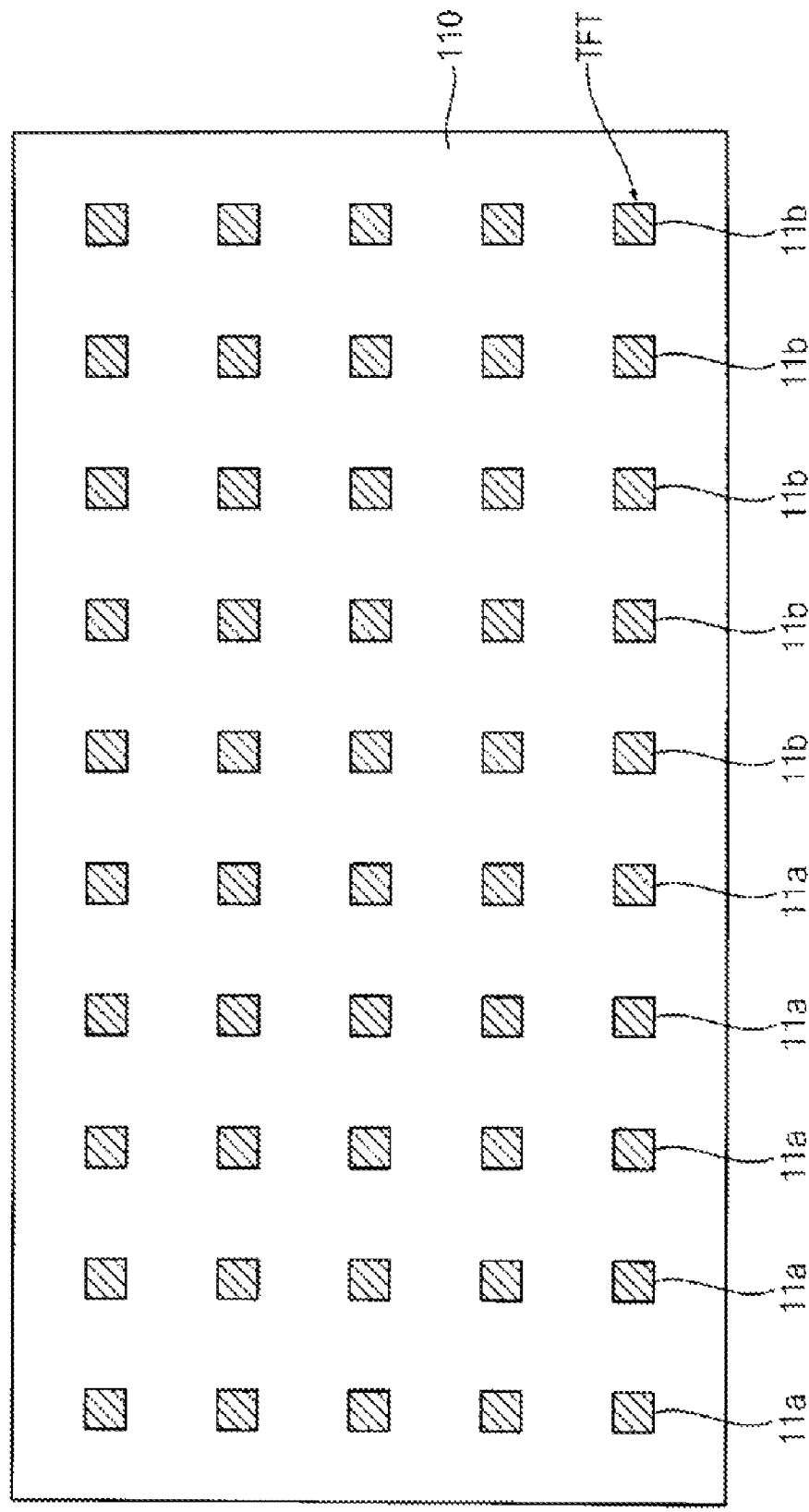
FIG. 8 is a plan view illustrating the TFTs of the second group on the base substrate of FIG. 7.

FIG. 7 is a cross-sectional view illustrating transferring the TFTs of the second group attached to the stamp unit onto the base substrate of FIG. 5. FIG. 8 is a plan view illustrating the TFTs of the second group on the base substrate of FIG. 7.

Referring to FIG. 7, the TFTs 11b of the second group, which are adhered to a stamp unit 10, are transferred on to a portion of the base substrate 110.

As shown in FIGS. 6 and 7, the TFTs on the silicon wafer 20 are repeatedly transferred to the base substrate 110.

Referring to FIG. 8, the TFTs are disposed at the whole area of the base substrate 110. The TFTs may be spaced apart from each other on the base substrate 110. For example, the TFTs may be separated by a regular interval in a longitudinal direction and/or in a horizontal direction of the base substrate 110.

FIG, 9 is an enlarged plan view illustrating one of the TFTs of FIG. 8. FIG. 10 is a cross-sectional view taken along a line I-I' in FIG. 9.

Figure 9:
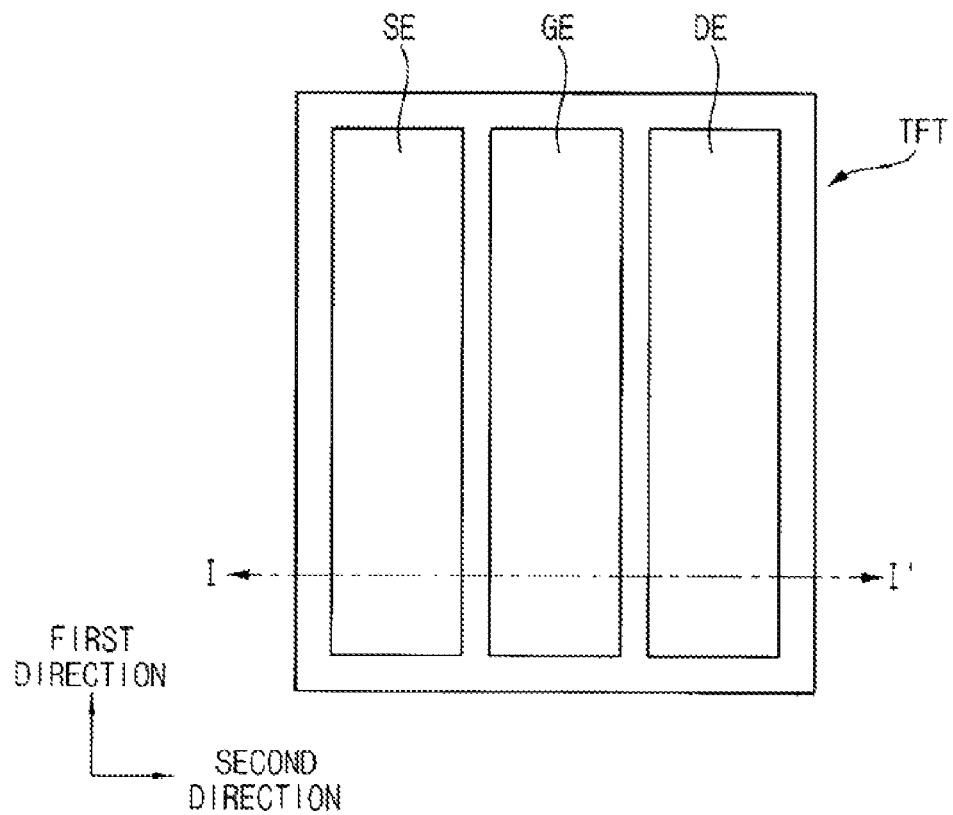
FIG. 9 is an enlarged plan view illustrating one of the TFTs of FIG. 8.
Figure 10:
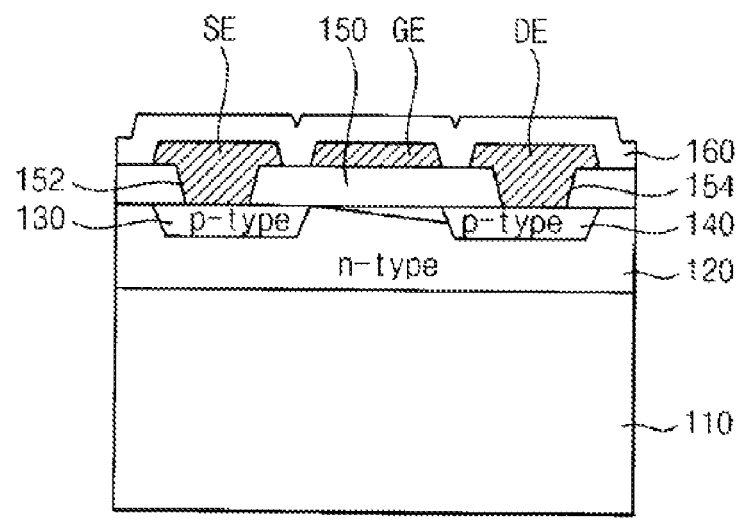
FIG. 10 is a cross-sectional view taken along a line I-I' in FIG. 9.

Referring to FIGS. 9 and 10, TFTs are disposed on the base substrate 110. For example, the main semiconductor layer 120 of each of the TFTs makes contact with the base substrate 110.

The gate electrode GE, the source electrode SE and the drain electrode DE are extended in a first direction, and are substantially parallel with each other. In addition, for example, the first semiconductor part 130 and the second semiconductor part 140 of each TFT may be extended along the first direction, and may be substantially parallel with the source electrode SE and the drain electrode DE.

Figure 11:
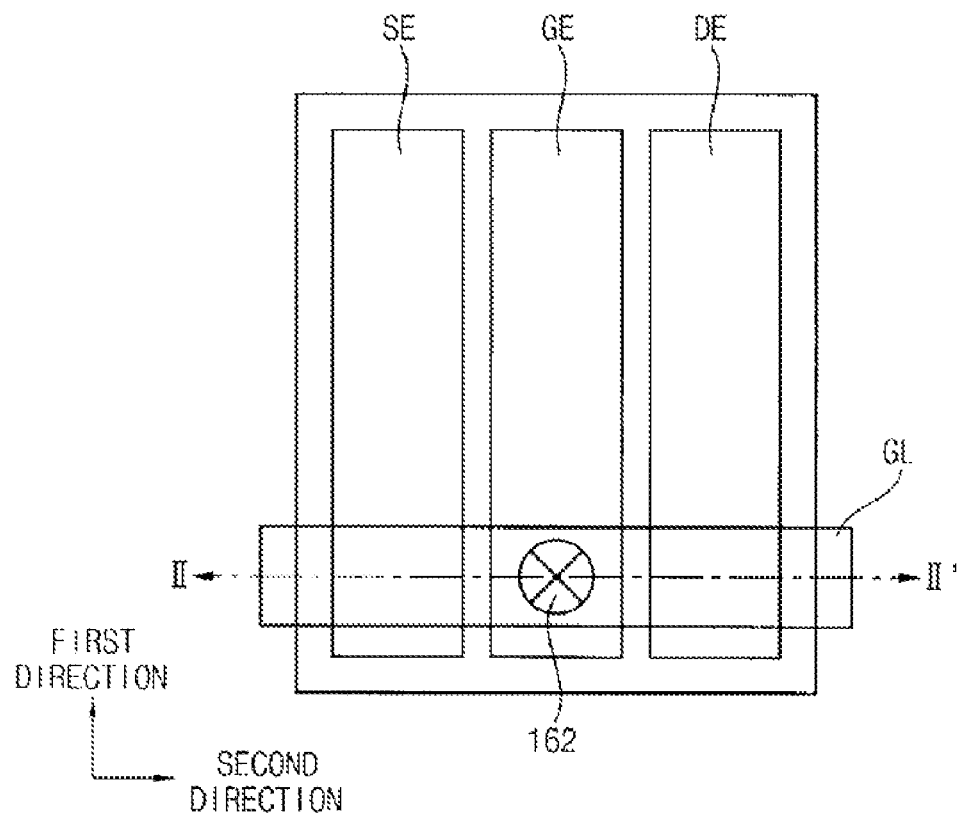
FIG. 11 is a plan view illustrating forming gate lines on the base substrate of FIG. 9.
Figure 12:
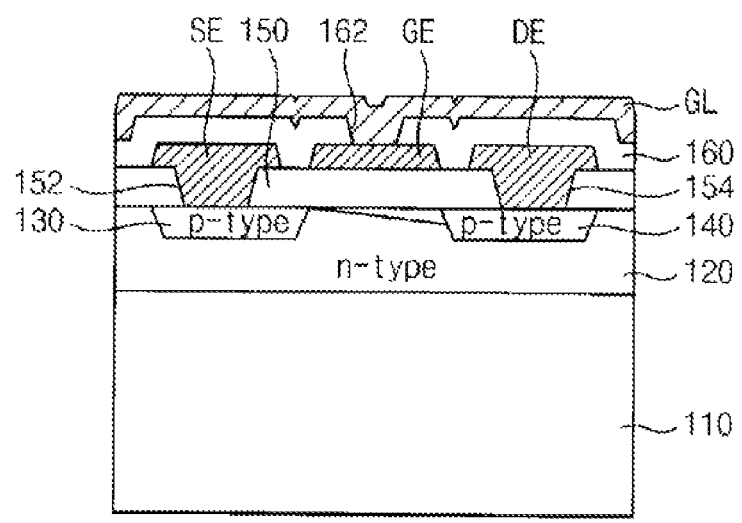
FIG. 12 is a cross-sectional view taken along a line II-II' in FIG. 11.

FIG. 11 is a plan view illustrating forming gate lines on the device of FIG. 9. FIG. 12 is a cross-sectional view taken along a line II-II' in FIG. 11.

Referring to FIGS. 11 and 12, an electrode protecting film 160 is partially removed to form a gate contact hole 162 for partially exposing a portion of the gate electrode GE. For example, the gate contact hole 162 is formed by dry-etching. The gate contact hole 162 may be formed by dry-etching using plasma. Also, the gate contact hole 162 is, for example, disposed at a portion of the gate electrode GE extending along the first direction.

After forming the gate contact hole 162, the gate line GL is disposed at the electrode protecting film 160. The gate line GL is electrically connected to the gate electrode GE through the gate contact hole 162. For example, the gate line GL extends along the second direction substantially perpendicular to the first direction, and is disposed on the electrode protecting film 160.

Figure 13:
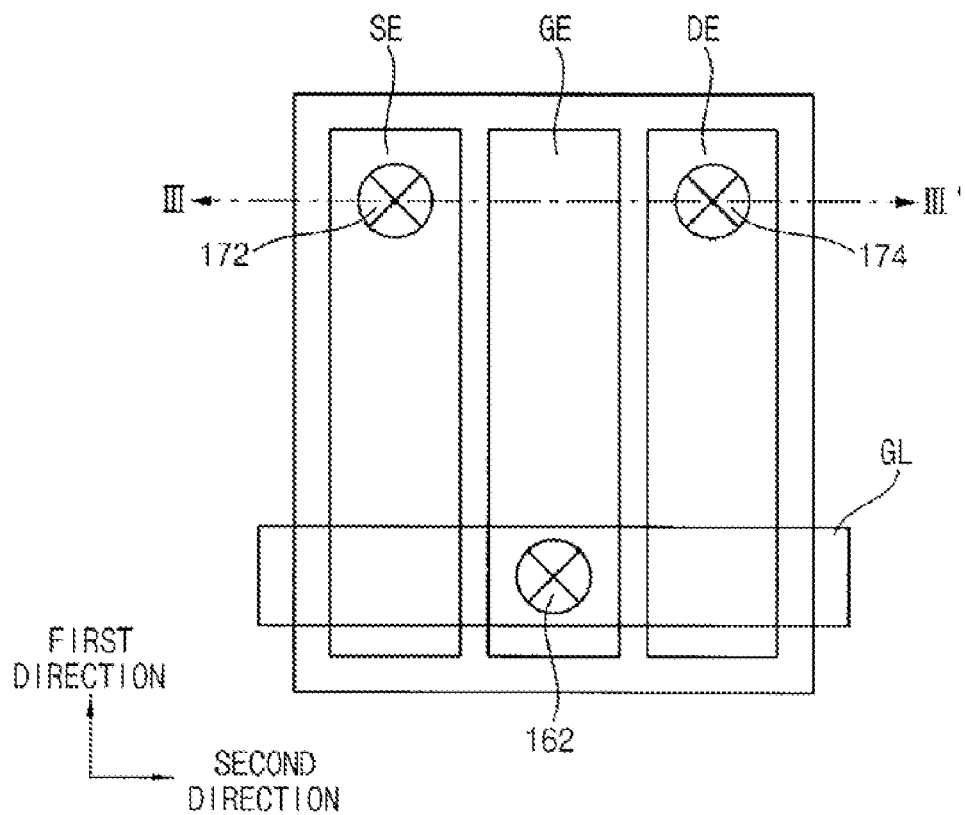
FIG. 13 is a plan view illustrating forming a gate protecting film on the base substrate of FIG. 11.
Figure 14:
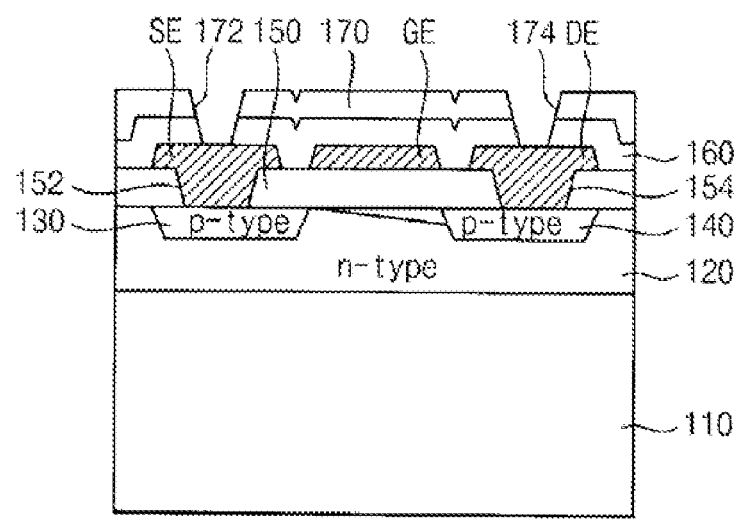
FIG. 14 is a cross-sectional view taken along a line III-III' in FIG. 13.

FIG. 13 is a plan view illustrating forming a gate protecting film on the device of FIG. 11. FIG. 14 is a cross-sectional view taken along a line III-III' in FIG. 13.

Referring to FIGS. 13 and 14, a gate protecting film 170 is formed on the electrode protecting film 160 to cover the gate line GL. The gate protecting film 170 includes, for example, silicon nitride (SiNx) or silicon oxide (SiOx).

After forming the gate protecting film 170, the electrode protecting film 160 and the gate protecting film 170 are partially etched to form a source contact hole 172 and a drain contact hole 174. For example, the source contact hole 172 and the drain contact hole 174 are formed by dry-etching. The source contact hole 172 and the drain contact hole 174 may be formed by dry-etching using plasma.

The electrode protecting film 160 and the gate protecting film 170 corresponding to the source electrode SE may be partially etched to form the source contact hole 172 for partially exposing the source electrode SE. The electrode protecting film 160 and the gate protecting film 170 corresponding to the drain electrode DE may be partially etched to form the drain contact hole 174 for partially exposing the drain electrode DE.

The source contact hole 172 and the drain contact hole 174 may be spaced apart from the gate contact hole 162 along the first direction. For example, the source contact hole 172 is disposed at a position corresponding to a first end of the source electrode SE in the first direction and the drain contact hole 174 is disposed at a position corresponding to a second end of the drain electrode DE in the first direction.

Figure 15:
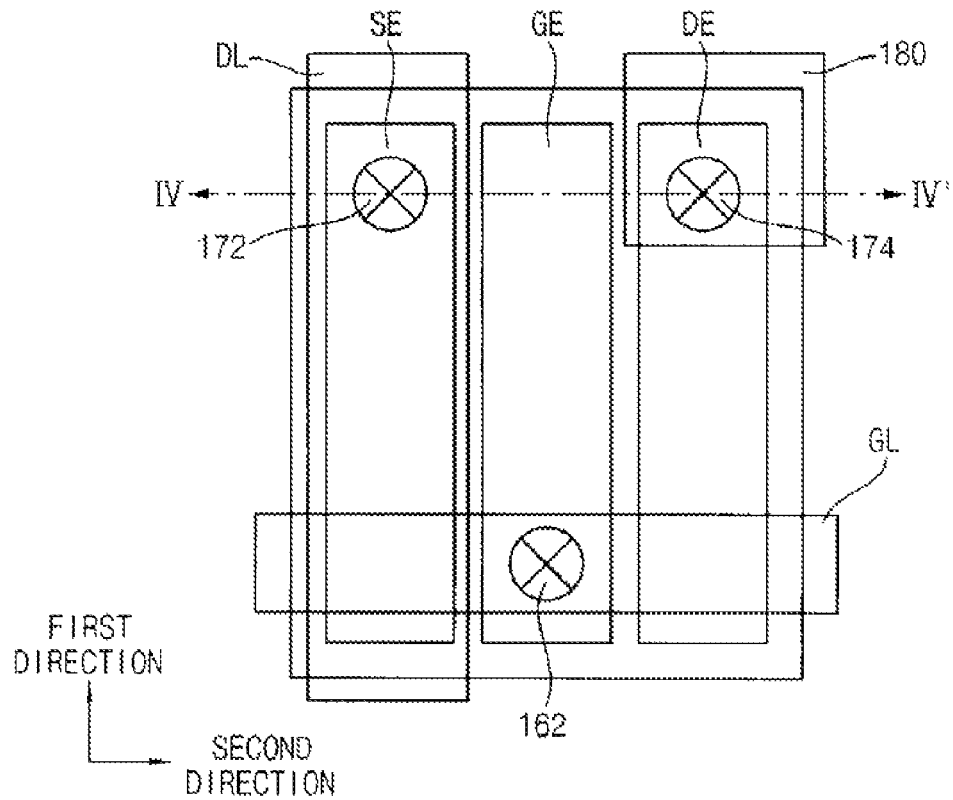
FIG. 15 is a plan view illustrating forming data lines and connecting electrodes on the base substrate of FIG. 13.
Figure 16:
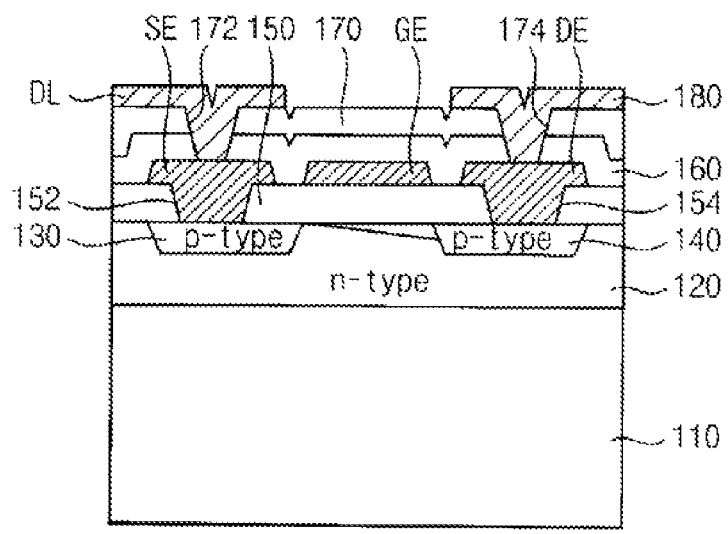
FIG. 16 is a cross-sectional view taken along a line IV-IV' in FIG. 15.

FIG. 15 is a plan view illustrating forming data lines and connecting electrodes on the base substrate of FIG. 13. FIG. 16 is a cross-sectional view taken along a line IV-IV' in FIG. 15.

Referring to FIGS. 15 and 16, a data line DL and a connecting electrode 180 are formed on the gate protecting film 170. The data line DL air and the connecting electrode 180 may be simultaneously formed on the gate protecting film 170.

The data line DL is for example, disposed on the gate protecting film 170, and is electrically connected to the source electrode SE through the source contact hole 172. The connecting electrode 180 is disposed on the gate protecting film 170, and is electrically connected to the drain electrode DE through the drain contact hole 174. For example, the data line DL and the gate line GL intersect each other and the data line DL is extended along the first direction on the gate protecting film 170.

Figure 17:
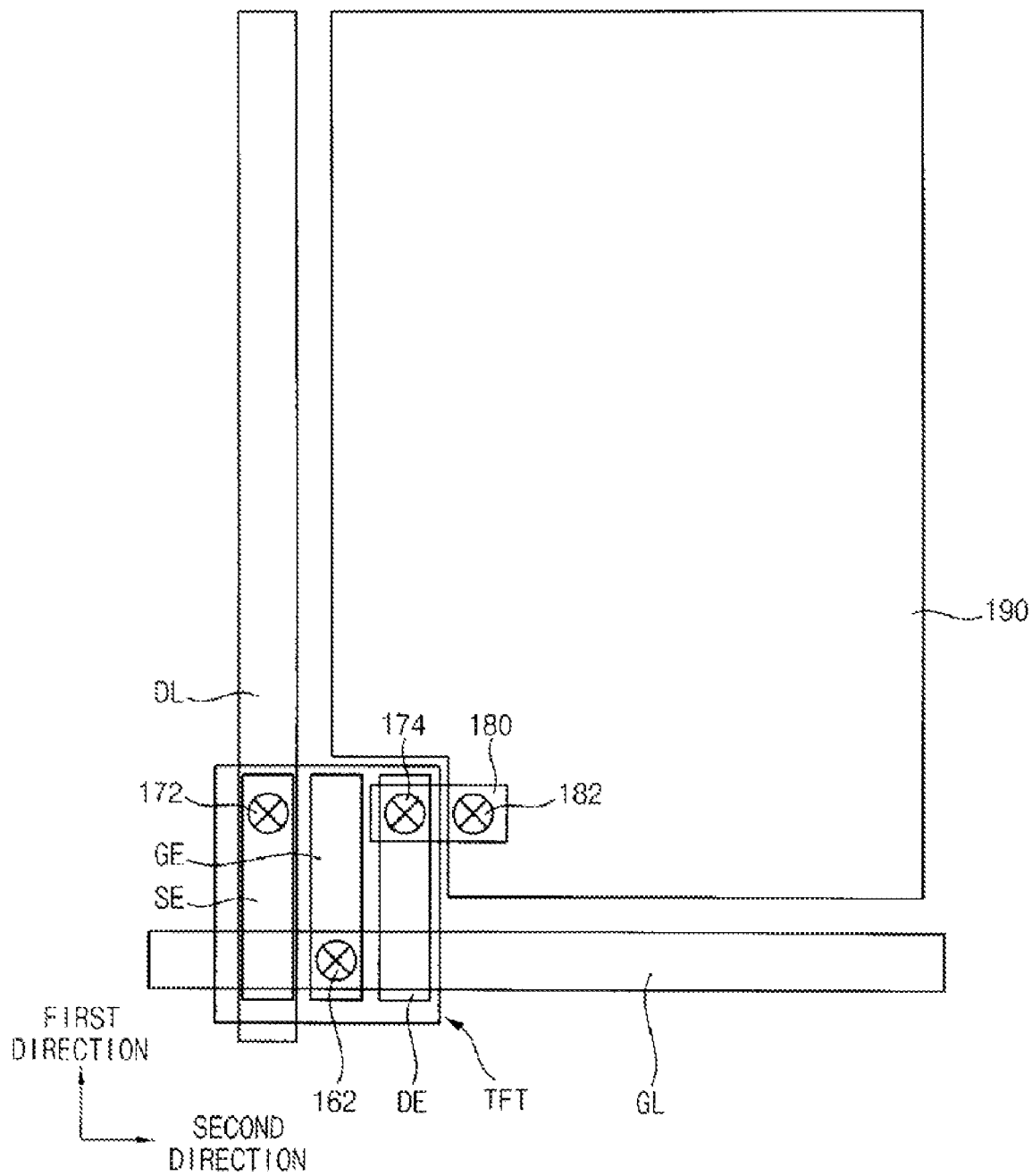
FIG. 17 is a plan view illustrating manufacturing a display substrate by forming pixel electrodes on the base substrate of FIG. 15.

FIG. 17 is a plan view illustrating manufacturing a display substrate by forming pixel electrodes on the device of FIG. 15.

Referring to FIGS. 16 and 17, a data protecting film (not shown) is disposed on the gate protecting film 170 to cover the data line DL and the connecting electrode 180. The data protecting film (not shown) includes, for example, an inorganic insulating film or an organic insulating film.

After forming the data protecting film, the data protecting film is partially etched to form a pixel contact hole 182 for partially exposing the connecting electrode 180.

A pixel electrode 190 is formed on the data protecting film, thereby completing a display substrate. Specifically, the pixel electrode 190 is disposed on the data protecting film, and is electrically connected to the connecting electrode 180 through the pixel contact hole 182. The pixel electrode 190 is, for example, disposed in a unit area. The gate line GL and air the data line DL intersecting each other define the unit area.

The pixel electrode 190 includes, for example, a transparent conductive material like indium tin oxide (ITO), indium zinc oxide (IZO), amorphous indium tin oxide (a-ITO), etc.

The display substrate manufactured by the above method is an array substrate having the TFTs and a pixel electrode 190. The array substrate is one element of a liquid crystal display (LCOD) panel. For example, the display substrate according to an embodiment of the present invention may be used for a transmission type display panel showing images by transmitting light. In exemplary embodiments, the base substrate 110 includes the transparent glass or synthetic resin, and the pixel electrode 190 includes the transparent conductive material, FIG. 18 is a plan view illustrating a display substrate in accordance with another exemplary embodiment of the present invention.

Figure 18:
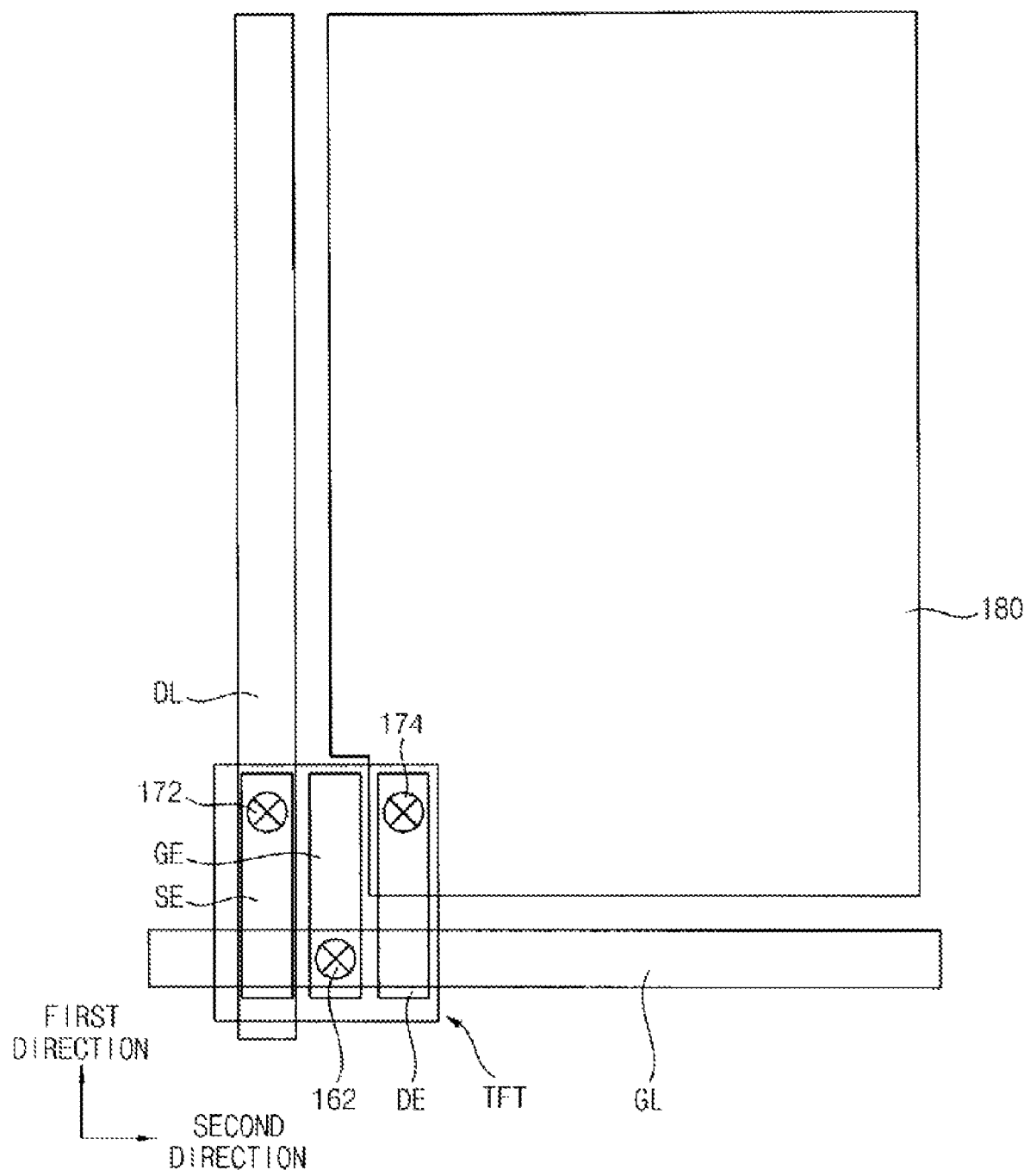
FIG. 18 is a plan view illustrating a display substrate in accordance with another exemplary embodiment of the present invention.

Referring to FIG. 18, a display panel is used for a reflecting display panel showing images by reflecting light.

In the device of FIG. 18, a base substrate 110 includes, for example, an opaque material. A connecting electrode 180 includes, for example, a material capable of reflecting light. The connecting electrode 180 may include silver (Ag), silver alloy or the like. The connecting electrode 180 is disposed at a unit area. A data line DL and a gate line GL define the unit area. Thus, the connecting electrode 180 may have a function which is substantially the same as the pixel electrode 190 explained above.

Thus, in a method of manufacturing a display substrate in FIG. 18, the data protecting film and the pixel electrode 190 may be omitted.

According to an embodiment of the present invention, a method of manufacturing the display substrate may reduce a manufacturing cost of forming TFTs on the base substrate 110, even if the size of a base substrate 110 is increased.

As the size of the base substrate 110 increases, the size of equipment of CVD for forming TFTs on the base substrate 110 increases. As a result, the installation and management cost increases with larger CVD equipment. However, in FIG. 18 the TFTs may be densely formed on the silicon wafer 20, and the TFTs are transferred onto the base substrate 110 by using stamp units 10. Thus, the size of equipment for CVD is not increased although the size of the base substrate 110 is increased. Therefore, the manufacturing cost may be decreased.

TFTs disposed on the silicon wafer 20 have improved electric characteristics than those directly formed on the base substrate 110. For example, when the TFTs are formed on the silicon wafer 20 and are transferred on the base substrate 110 by stamp units 10, the TFTs may be formed in various conditions, such as a high temperature, a highly erosive etching process, etc., so that the electric characteristics of TFTs disposed on the base substrate 110 may be enhanced.

Typically, the TFTs formed at high temperature have enhanced characteristics. For devices in which the TFTs are formed on the substrate 110, when the base substrate 110 includes a polymer, the base substrate 110 may melt under the high temperature for forming the TFTs. In FIGS. 1 to 18, when the TFTs formed on the silicon wafer 20 are transferred on to the base substrate 110 by stamp units 10, the base substrate 110 on which the TFTs are formed may include a polymer.

According to an embodiment of the present invention, the TFTs are not directly formed on the base substrate, but are transferred from the silicon wafer onto the base substrate, the size of equipment for CVD may not be increased, although the size of the display substrate is increased, and as a result, manufacturing costs of the display substrate may be reduced.

Electric characteristics of the TFTs formed separately from the base substrate may be superior to those of TFTs directly formed on the base substrate. As a result the display substrate having high quality may be manufactured.

Also, the TFTs on the silicon wafer are transferred on to the base substrate by the stamp units so that thermal deformation of the base substrate including a polymer may be substantially prevented, Although exemplary embodiments of the present invention have been described it is understood that the present invention should not be limited to exemplary embodiments but various changes and modifications can be made by one ordinary skilled in the art within the spirit and scope of the disclosure.

What is claimed is:

1. A method of manufacturing a display substrate, comprising:
    forming a plurality of thin-film transistors (TFTs) on a silicon wafer;
    separating the TFTs from the silicon wafer using a stamp unit, the stamp unit having a stamp body and a plurality of stamps disposed on a surface of the stamp body and corresponding to the TFTs, the stamps being spaced apart from each other and protruding from the surface of the stamp body;
    transferring the TFT attached to the stamp unit onto a base substrate directly from the stamp unit; and
    forming a pixel electrode electrically connected to each of the TFTs.

2. The method of claim 1, wherein forming the TFTs comprises:
    forming a semiconductor layer;
    forming a gate insulating film disposed on the semiconductor layer and having a first contact hole and a second contact hole for partially exposing the semiconductor layer;
    forming a gate electrode disposed on the gate insulating film and interposed between the first contact hole and the second contact hole;
    forming a source electrode spaced apart from a first surface of the gate electrode on the gate insulating film, and electrically connected to the semiconductor layer through the first contact hole; and
    forming a drain electrode spaced apart from a second surface of the gate electrode on the gate insulating film, and electrically connected to the semiconductor layer through the second contact hole.

3. The method of claim 2, wherein the gate electrode, the source electrode and the drain electrode extend along substantially the same direction.

4. The method of claim 2, wherein forming the TFTs further comprises forming an electrode protecting film disposed on the gate insulating film to cover the gate electrode, the source electrode and the drain electrode.

5. The method of claim 4, wherein forming the pixel electrode comprises:
   forming a gate line electrically connected to the gate electrode of each of the TFTs;
   forming a data line electrically connected to the source electrode of each of the TFTs; and
   forming a pixel electrode electrically connected to the drain electrode of each of the TFTs.

6. The method of claim 5, wherein forming the gate line comprises:
   partially removing the electrode protecting film to partially expose the gate electrode, thereby forming a gate contact hole; and
   forming the gate line electrically connected to the gate electrode through the gate contact hole on the electrode protecting film.

7. The method of claim 6, wherein the pixel electrode comprises a transparent conductive material.

8. The method of claim 7, wherein forming the data line comprises:
   forming a gate protecting film on the electrode protecting film to cover the gate line;
   forming a source contact hole by etching a portion partially removing the electrode protecting film and the gate protecting film to form a source contact hole through which the source electrode is partially exposed and a drain contact hole through which the drain electrode is partially exposed; and
   forming the data line electrically connected to the source electrode through the source contact hole and a connecting electrode electrically connected to the drain electrode through the drain contact hole on the gate protecting film.

9. The method of claim 8, wherein forming the pixel electrode comprises:
   forming a data protecting film on the gate protecting film to cover the data line and the connecting electrode;
   partially etching the data protecting film to form a pixel contact hole through which the connecting electrode is partially exposed; and
   forming the pixel electrode electrically connected to the connecting electrode through the pixel contact hole on the data protecting film.

10. The method of claim 6, wherein the pixel electrode comprises metal reflecting light.

11. The method of claim 10, wherein the data line and the pixel electrode are formed from substantially the same layer.

12. The method of claim 11, wherein forming the data line and the pixel electrode comprises:
   forming the gate protecting film on the electrode protecting film to cover the gate line;
   partially etching the electrode protecting film and the gate protecting film to form a source contact hole through which the source electrode is partially exposed and a drain contact hole through which the drain electrode is partially exposed; and
   forming the data line electrically connected to the source electrode through the source contact hole and the pixel electrode electrically connected to the drain electrode through the drain contact hole on the gate protecting film.

13. The method of claim 1, wherein an adhesive surface of the stamp has substantially the same shape and size as an upper surface of each of the TFTs.

14. The method of claim 1, wherein an adhesive strength between the TFTs and the silicon wafer is smaller than an adhesive strength between the TFTs and the stamp, and an adhesive strength between the TFTs and the base substrate is greater than the adhesive strength between the TFTs and the stamp.

15. The method of claim 1, wherein a plurality of the TFTs is disposed on the silicon wafer in a matrix configuration.

16. The method of claim 15, wherein the plurality of the stamps is disposed on a surface of the stamp body corresponding to the TFTs, and the stamps are spaced apart from each other by a regular interval.

17. The method of claim 1, wherein the base substrate comprises a transparent material.

18. The method of claim 17, wherein the base substrate comprises at least one selected from the group consisting of glass, quartz and transparent synthetic resin.

19. The method of claim 1, wherein the base substrate comprises metal.

20. The method of claim 19, wherein the base substrate comprises stainless steel.

21. The method of claim 1, wherein a surface of the base substrate is treated by cleaning or plasma implanting.

22. A method of manufacturing a display substrate, comprising:
   forming a plurality of thin-film transistor (TFTs) on a silicon wafer, the TFTs having a gate electrode, a source electrode, a drain electrode and an electrode protecting film covering the gate electrode, the source electrode and the drain electrode;
   separating the TFTs from the silicon wafer using a stamp unit, the stamp unit having a stamp body and a plurality of stamps disposed on a surface of the stamp body and corresponding to each of the TFTs, the stamps being spaced apart from each other and protruding from the surface of the stamp body;
   transferring the TFTs attached to the stamp unit onto a base substrate using a stamp unit;
   forming a gate line electrically connected to the gate electrode of each of the TFTs;
   forming a data line electrically connected to the source electrode of each of the TFTs; and
   forming a pixel electrode electrically connected to the drain electrode of each of the TFTs,
   wherein forming the gate line comprises;
   partially removing the electrode protecting film to partially expose the gate electrode, thereby forming a gate contact hole; and
   forming the gate line electrically connected to the gate electrode through the gate contact hole on the electrode protecting film.

23. The method of claim 22, wherein forming the TFTs comprises:
   forming a semiconductor layer;
   forming a gate insulating film disposed on the semiconductor layer and having a first contact hole and a second contact hole for partially exposing the semiconductor layer;
   forming the gate electrode disposed on the gate insulating film and interposed between the first contact hole and the second contact hole;
   forming the source electrode spaced apart from a first surface of the gate electrode on the gate insulating film, and electrically connected to the semiconductor layer through the first contact hole; and forming the drain electrode spaced apart from a second surface of the gate electrode on the gate insulating film, and electrically connected to the semiconductor layer through the second contact hole.

24. The method of claim 23, wherein the gate electrode, the source electrode and the drain electrode extend along substantially the same direction.

25. The method of claim 23, wherein forming the TFTs further comprises forming the electrode protecting film disposed on the gate insulating film to cover the gate electrode, the source electrode and the drain electrode.

26. The method of claim 25, wherein the pixel electrode comprises a transparent conductive material.

27. The method of claim 26, wherein forming the data line comprises:

forming a gate protecting film on the electrode protecting film to cover the gate line;

forming a source contact hole by etching a portion partially removing the electrode protecting film and the gate protecting film to form a source contact hole through which the source electrode is partially exposed and a drain contact hole through which the drain electrode is partially exposed; and forming the data line electrically connected to the source electrode through the source contact hole and a connecting electrode electrically connected to the drain electrode through the drain contact hole on the gate protecting film.

28. The method of claim 27, wherein forming the pixel electrode comprises:

forming a data protecting film on the gate protecting film to cover the data line and the connecting electrode;

partially etching the data protecting film to form a pixel contact hole through which the connecting electrode is partially exposed; and forming the pixel electrode electrically connected to the connecting electrode through the pixel contact hole on the data protecting film.

29. The method of claim 25, wherein the pixel electrode comprises metal reflecting light.

30. The method of claim 29, wherein the data line and the pixel electrode are formed from substantially the same layer.

31. The method of claim 30, wherein forming the data line and the pixel electrode comprises:

forming the gate protecting film on the electrode protecting film to cover the gate line;

partially etching the electrode protecting film and the gate protecting film to form a source contact hole through which the source electrode is partially exposed and a drain contact hole through which the drain electrode is partially exposed; and forming the data line electrically connected to the source electrode through the source contact hole and the pixel electrode electrically connected to the drain electrode through the drain contact hole on the gate protecting film.

32. The method of claim 22, wherein the stamp unit comprises:

a stamp body; and a stamp disposed on a surface of the stamp body and adhering to each of the TFTs.

33. The method of claim 22, wherein an adhesive surface of the stamp has substantially the same shape and size as an upper surface of each of the TFTs.

34. The method of claim 22, wherein an adhesive strength between the TFTs and the silicon wafer is smaller than an adhesive strength between the TFTs and the stamp, and an adhesive strength between the TFTs and the base substrate is greater than the adhesive strength between the TFTs and the stamp.

35. The method of claim 32, wherein a plurality of the TFTs is disposed on the silicon wafer in a matrix configuration.

36. The method of claim 35, wherein a plurality of the stamps is disposed on a surface of the stamp body corresponding to the TFTs, and the stamps are spaced apart from each other by a regular interval.

* * * * *